(12) United States Patent
Lee et al.

(10) Patent No.: US 9,424,911 B2
(45) Date of Patent: Aug. 23, 2016

(54) METHOD AND APPARATUS FOR SCREENING MEMORY CELLS FOR DISTURB FAILURES

(71) Applicant: Marvell World Trade Ltd., St. Michael (BB)

(72) Inventors: Winston Lee, Palo Alto, CA (US);
Moon-Hae Son, San Jose, CA (US);
Peter Lee, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/567,955

(22) Filed: Dec. 11, 2014

(65) Prior Publication Data

US 2015/0194207 A1    Jul. 9, 2015

Related U.S. Application Data

(60) Provisional application No. 61/923,867, filed on Jan. 6, 2014.

(51) Int. Cl.
| | |
|---|---|
| G11C 11/00 | (2006.01) |
| G11C 11/419 | (2006.01) |
| G11C 11/412 | (2006.01) |
| G11C 11/413 | (2006.01) |

(52) U.S. Cl.
CPC .......... G11C 11/419 (2013.01); G11C 11/412 (2013.01); G11C 11/413 (2013.01)

(58) Field of Classification Search
CPC .......... G11C 5/14; G11C 5/063; G11C 16/30; G11C 5/147; G11C 29/021; G11C 2207/2254
See application file for complete search history.

(56) References Cited

U.S. PATENT DOCUMENTS

| | | | | |
|---|---|---|---|---|
| 4,310,900 A | * | 1/1982 | Tsujide | G11C 11/419 365/190 |
| 5,841,714 A | * | 11/1998 | Sher | G11C 29/46 365/189.09 |
| 2009/0161449 A1 | * | 6/2009 | Yamagami | G11C 11/419 365/189.16 |
| 2010/0208536 A1 | * | 8/2010 | Deng | G11C 8/08 365/201 |
| 2012/0307579 A1 | * | 12/2012 | Huber | G11C 29/12 365/201 |
| 2013/0163357 A1 | * | 6/2013 | Buer | G11C 8/08 365/201 |

* cited by examiner

*Primary Examiner* — Son Dinh
*Assistant Examiner* — Uyen B Tran

(57) ABSTRACT

Embodiments include a method comprising: receiving a first voltage; and while testing a memory cell: modifying the first voltage to generate a second voltage that is different from the first voltage; and performing a first read operation on the memory cell, based on applying (i) the second voltage to an array of transistors of the memory cell and (ii) the first voltage to the memory cell.

20 Claims, 10 Drawing Sheets

METHOD AND APPARATUS FOR SCREENING MEMORY CELLS FOR DISTURB FAILURES

CROSS REFERENCE TO RELATED APPLICATIONS

This claims priority to U.S. Provisional Patent Application No. 61/923,867, filed on Jan. 6, 2014, which is incorporated herein by reference in its entirety.

TECHNICAL FIELD

Embodiments of the present disclosure relate to memory cells, and in particular to method and apparatus for screening memory cells for disturb failures.

BACKGROUND

A memory cell, e.g., a static random-access memory (SRAM) cell, may develop a disturb failure during an operation of the memory cell. A SRAM memory cell typically has a word line and two bit lines. In an example, the wordline of a SRAM memory cell is turned ON and the two bit lines are precharged, and the memory cell is said to be disturbed (i.e., has undergone a disturb failure) if the content of the memory cell is flipped (corrupted) to an opposite state, without an explicit write command to flip the state. The unintentional flipping of the content of the memory cell leads to a corruption of the data stored in the memory cell, thereby leading to the disturb failure of the memory cell.

Disturb failure in a memory cell may occur, for example, due to mismatch in the transistors within the memory cell, noise in the transistors, imbalance among the transistors, etc. As semiconductor memory devices continue having lower geometry with advancement of technology, the memory devices are becoming more prone to such disturb failures.

For example, in a SRAM memory, many memory cells are usually connected to a single word line. During a read operation, as many memory cells are connected to the single word line, all the memory cells along the accessed word line are enabled simultaneously (i.e., the memory cells are coupled to their respective bit lines). However, not all the bit lines from the memory cells are connected to sense amplifiers. Only bits lines of those memory cells, which are to be read, are connected to the sense amplifiers via local and/or global multiplexers. In other words, not all the memory cells along the accessed word line are read. Despite not being read, when the memory cells are imbalanced or mismatched, the act of connecting them to bit lines that are pre-charged to the supply voltage (e.g., VDD) can result in cell upsets or data corruption. One reason for the data corruption may be a low threshold voltage VT on a driver transistor of the side of the memory cell where a data "1" is stored. Another reason for the data corruption may be that the load transistors are weak or mismatched. Such data corruption leads to a disturb failure in the memory cell.

Some memory cells may be more prone to a disturb failure than other memory cells. For example, assume a SRAM memory having at least a first memory cell and a second memory cell, where a first plurality of transistors included in the first memory cell have some mismatches (or where a transistor of the first memory cell is relatively weak). Accordingly, the first memory cell may be more prone to disturb failure while in use (e.g., compared to the second memory cell). However, during a conventional testing of the memory (e.g., in which the memory cells of the memory are repeatedly read and/or written to), it may not be easily possible to identify that the first memory cell is more prone to disturb failure, as the first memory cell may not fail during testing (but may fail during actual use).

SUMMARY

In various embodiments, the present disclosure provides a method comprising: receiving a first voltage; and while testing a memory cell: modifying the first voltage to generate a second voltage that is different from the first voltage; and performing a first read operation on the memory cell, based on applying (i) the second voltage to an array of transistors of the memory cell and (ii) the first voltage to the memory cell. In an embodiment, the second voltage is lower than the first voltage. In an embodiment, the method further comprises: during a regular operation of the memory cell, performing a plurality of read operations on the memory cell, wherein each of the plurality of read operations is based on applying the first voltage to (i) the array of transistors and (ii) the memory cell. In an embodiment, the method further comprises: while testing the memory cell and prior to performing the first read operation, writing first data to the memory cell. In an embodiment, the memory cell is a static random-access memory (SRAM) cell.

In various embodiments, the present disclosure further provides a memory system comprising: a memory cell comprising an array of transistors, a word line, and two bit lines; and a circuit configured to: receive a first voltage, and while the memory cell is being tested: modify the first voltage to generate a second voltage that is different from the first voltage, and while a first read operation is being performed on the memory cell, apply (i) the second voltage to the array of transistors and (ii) the first voltage to the memory cell. In an embodiment, the second voltage is lower than the first voltage. In an embodiment, the circuit is further configured to: during a regular operation of the memory cell and while each of a plurality of read operations is being performed on the memory cell, apply the first voltage to (i) the array of transistors and (ii) the two bit lines. In an embodiment, the memory system is configured to: while the memory cell is being tested and prior to the first read operation being performed, write first data to the memory cell; and while the memory cell is being tested and subsequent to the first read operation being performed, perform a second read operation on the memory cell to read second data from the memory cell, based on the circuit applying the first voltage to (i) the array of transistors and (ii) the two bit lines. In an embodiment, the circuit comprises a resistive voltage divider configured to modify the first voltage to generate the second voltage that is different from the first voltage, wherein the resistive voltage divider is enabled while the first read operation is being performed. In an embodiment, the memory cell is a static random-access memory (SRAM) cell.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1:
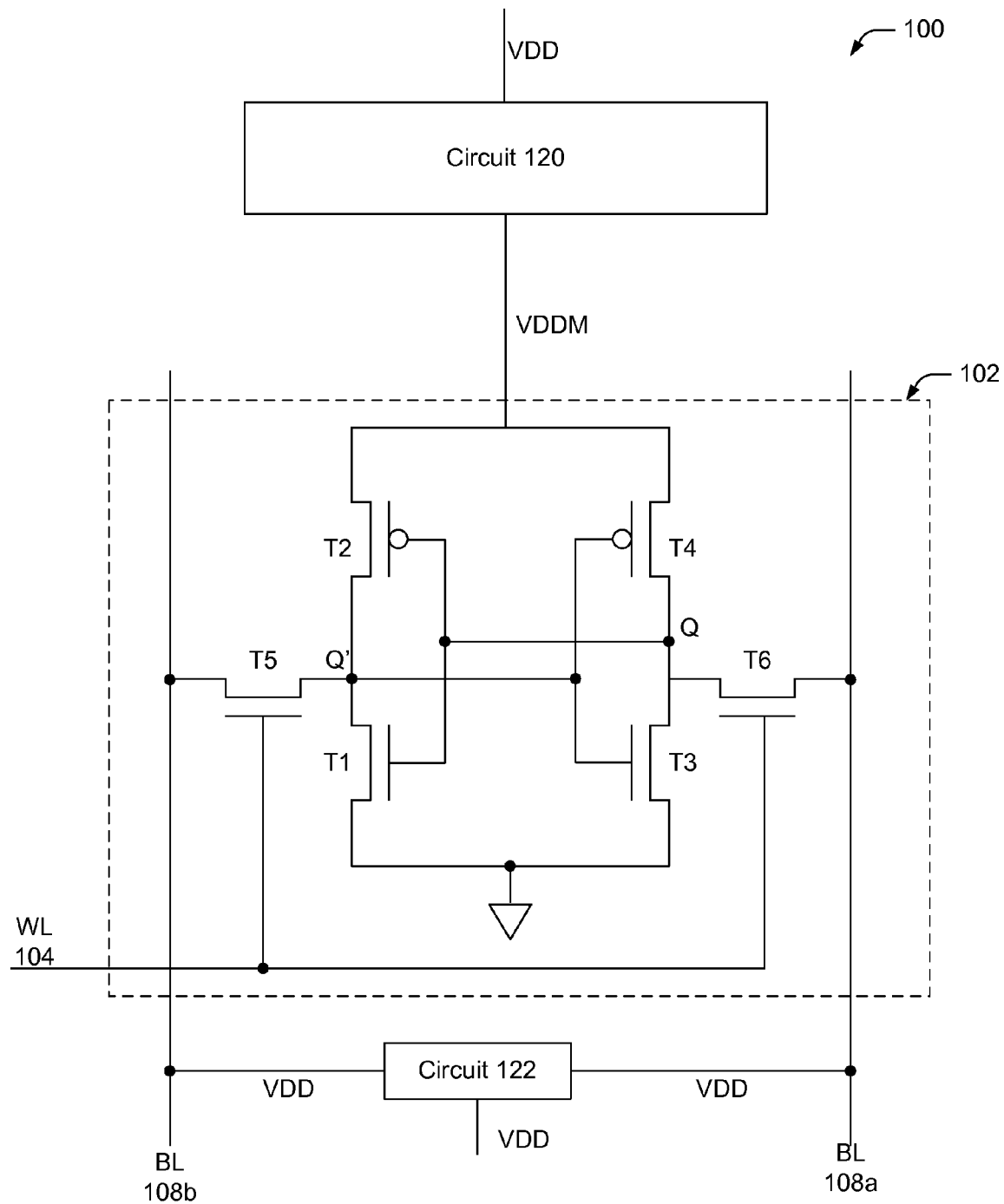
FIG. 1 schematically illustrates a system for screening a memory cell for potential disturb failure.

FIG. 1 schematically illustrates a system 100 for screening a memory cell 102 (henceforth also referred to as "cell 102," illustrated using a dotted line in FIG. 1) for potential disturb failure. The system 100 comprises the cell 102, and circuits 120 and 122. The cell 102 is, for example, a SRAM memory cell.

The circuits 120 and 122 receive a voltage VDD. The circuit 120 selectively outputs voltage VDDM, and circuit 122 selectively outputs voltage VDD. In an embodiment, while the cell 102 is being tested (e.g., during at least a part of a testing phase of the cell 102, to determine if the cell 102 is prone to disturb failure), the voltage VDDM is not equal to VDD (e.g., the voltage VDDM is less than VDD). However, during an operational phase of the cell 102 (e.g., during a normal or regular use of the cell 102), the voltage VDDM is substantially equal to VDD. Operations of the circuits 102a and 102b will be discussed in more detail herein later.

The cell 102 comprises six transistors T1, ..., T6. The transistors T1, ..., T6 are, for example, metal oxide semiconductor field effect transistor (MOSFET). A bit in the cell 102 is stored on four transistors (T1, T2, T3, T4) that form two cross-coupled inverters. A wordline (WL) 104 is configured to control the transistors T5 and T6. Two bit lines BL 108a and BL 108b are respectively coupled to the transistors T5 and T6.

In an example, the cell 102 operates in a standby state if the WL 104 is not asserted, and the access transistors T5 and T6 disconnect the cell 102 from the bit lines BL 108a and BL 108b. While in the standby state, the two cross-coupled inverters formed by transistors T1, ..., T4 continue to reinforce each other as long as these transistors are connected to the supply voltage VDDM.

Assume that the content of the cell 102 is a 1 stored at a node Q, and a value of 0 is stored at a node Q' of the cell 102. During a regular read cycle, both the bit lines BL 108a and BL 108b are pre-charged to a logical 1, and then WL 104 is asserted, enabling both the access transistors T5 and T6. As a result, the values stored in the nodes Q and Q' are transferred to the respective bit lines, e.g., by leaving BL 108a at its precharged value and discharging BL 108b through transistors T1 and T5 to a logical 0 (i.e. eventually discharging through the transistor T1, which is turned on because the Q is logically set to 1). Also, the transistors T4 and T6 pull the bit line BL 108a toward VDDM, a logical 1 (i.e. eventually being charged by the transistor T4, which is turned on because Q' is logically set to 0). If the content of the memory is a 0, the opposite happens, i.e., and BL 108b is be pulled toward 1 and BL 108a is pulled toward 0. Thus, the bit lines BL 108a and BL 108b will have a small voltage difference between them, based on whether a 0 or a 1 is stored in the cell 102. This difference in voltage (e.g., whether the voltage of bit line BL 108a is higher than that of the bit line BL 108b, or vice versa) is sensed by a sense amplifier (not illustrated in FIG. 1), to determine whether a 0 or a 1 is stored in the cell 102.

During a write operation, the bit lines BL 108a and BL 108b are selectively pre-charged, based on whether a 0 or a 1 is to be written to the cell 102. For example, if a 0 is to be written, then the BL 108b is set to 1 and the BL 108a is set to 0, and vice versa. The WL 104 is then asserted, and the value that is to be stored in the cell 102 is latched in the cell 102.

Figure 2A:
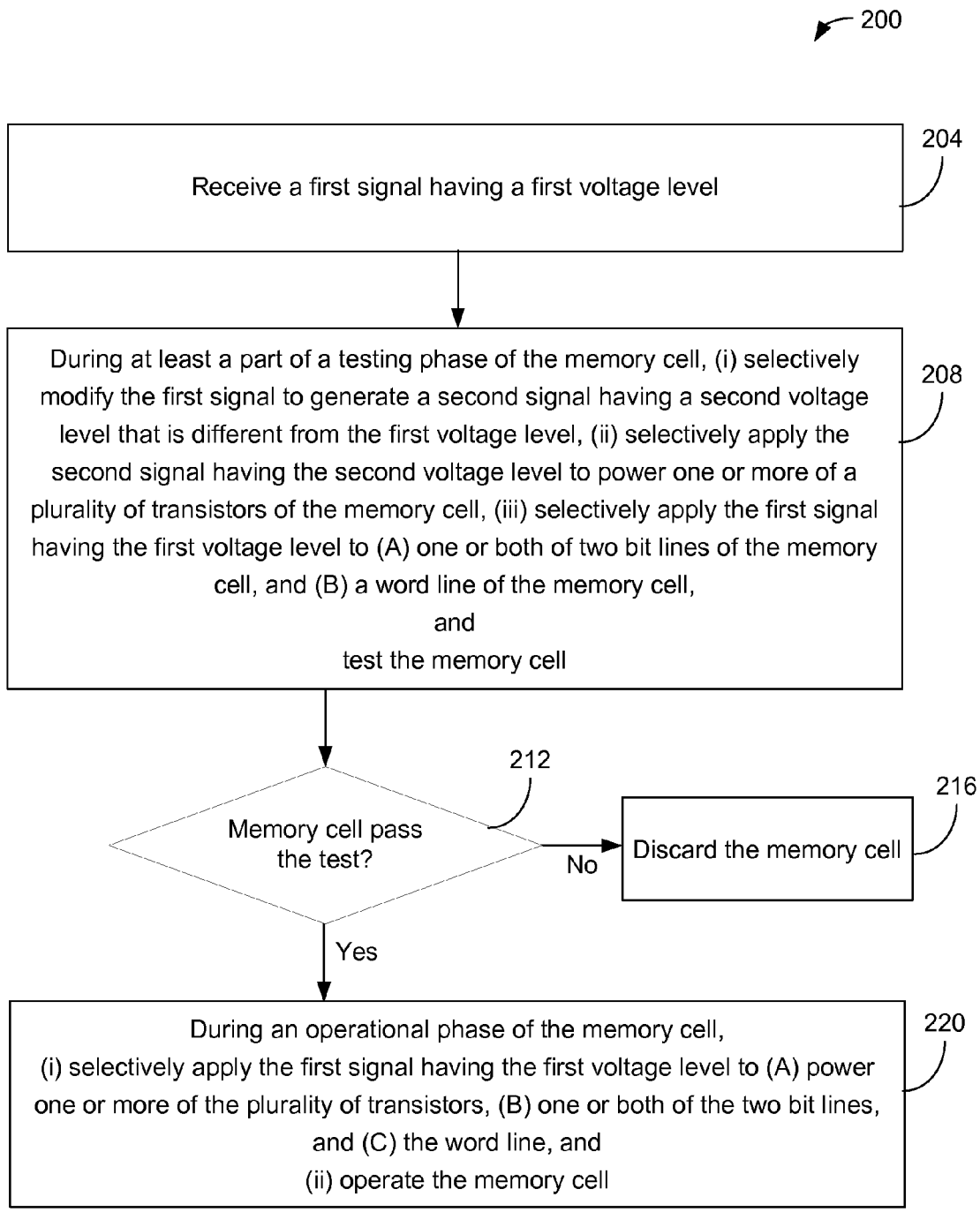
FIG. 2A is a flow diagram of an example method of testing and operating a memory cell.

FIG. 2A is a flow diagram of an example method 200 of testing and operating a memory cell (e.g., the memory cell 102 of FIG. 1). At 204, a first signal having a first voltage level (e.g., the voltage VDD) is received (e.g., by the circuits 102a and 102b). At 208, during at least a part of a testing phase of the memory cell, the first signal is selectively modified (e.g., by the circuit 102a) to generate a second signal having a second voltage level (e.g., voltage VDDM) that is different from the first voltage level. In an embodiment, during the part of the testing phase of the memory cell, the second voltage level is less than the first voltage level. Also, during a part of the testing phase of the memory cell, the second signal having the second voltage level is selectively applied to power one or more of a plurality of transistors (e.g., transistors T1, ..., T4) of the memory cell. For example, the memory cell comprises two cross-coupled inverters formed by four transistors (e.g., formed by transistors T1, ..., T4), and the second signal having the second voltage level is applied to power these four transistors. Also, during a part of the testing phase of the memory cell, a third signal having substantially the first voltage level is selectively applied to (A) one or both of two bit lines of the memory cell (e.g., BL 108a and BL 108b), and (B) a word line of the memory cell (e.g., WL 104). Subsequently, the memory cell is tested, e.g., to determine if the memory cell is prone to failure (e.g., is likely to undergo disturb failure during an operational phase of the memory cell). Testing of the memory cell will be discussed in further detail herein later.

At 212, a determination is made as to whether the memory cell has passed the test. If the memory cell has failed the test, at 216, the memory cell is discarded. For example, an entire memory chip that contains the memory cell is discarded, only the specific memory cell is discarded (e.g., a spare memory cell in the memory chip replaces the failed memory cell), and/or the like.

If the memory cell passes the test, at 220, the memory cell operates at an operation phase. In the operational phase, the first signal having the first voltage level is selectively applied to (A) power one or more of the plurality of transistors, (B) one or both of the two bit lines, and (C) the word line, and the memory cell is operated.

Figure 2B:
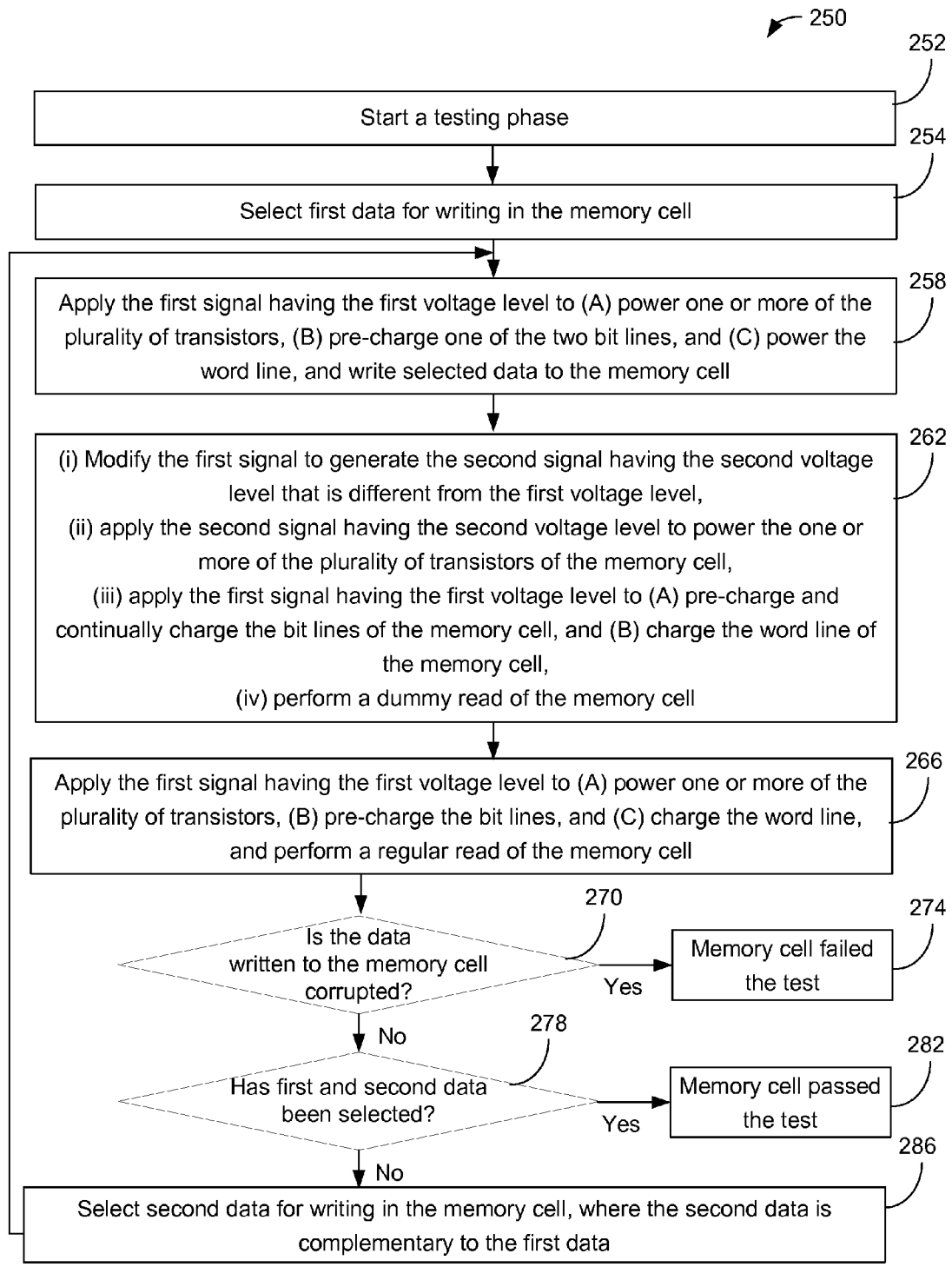
FIG. 2B is a flow diagram of an example method of testing a memory cell, to screen the memory cell for potential disturb failure.

FIG. 2B is a flow diagram of an example method 250 of testing a memory cell (e.g., the memory cell 102 of FIG. 1), to screen the memory cell for potential disturb failure. The method 250 of FIG. 2B corresponds to the block 208 of FIG. 2A.

At 252, a testing phase to test the memory cell starts. At 254, first data is selected for writing in the memory cell. The first data is, for example, one of a bit 0 or a bit 1. At 258, the first signal (e.g., as discussed with respect to FIG. 2A) having the first voltage level (e.g., voltage VDD) is applied to (A)

power one or more of the plurality of transistors of the memory cells (e.g., transistors T1, . . . , T4), (B) pre-charge one of the two bit lines (e.g., BL 108a or BL 108b, based on whether 1 or 0 is selected at 252 for writing), and (C) power the word line (e.g., WL 104), and the selected data is written to the memory cell. Thus, for example, at 258, the selected data is written to the memory cell using the voltage VDD.

At 262, the first signal is modified to generate the second signal having the second voltage level (e.g., VDDM) that is different from the first voltage level (e.g., using the circuit 120). The second signal having the second voltage level is applied to power the one or more of the plurality of transistors of the memory cell, and the first signal having the first voltage level is applied to (A) pre-charge and continually charge the bit lines of the memory cell, and (B) charge the word line of the memory cell. Also, a dummy read is performed on the memory cell.

Thus, at 262, during the dummy read operation, voltage VDDM (having a value that is less than VDD) is applied to the array of transistors T1, . . . , T4, while voltage VDD is applied to the bit lines BL 108a and 108b and the word line WL 104 of the cell 102. Furthermore, during a regular read operation (e.g., a read operation during the operational phase), the bit lines BL 108a and 108b are pre-charged at the beginning of the read cycle (e.g., prior to enabling the word line WL 104)—but once the bit lines BL 108a and 108b are fully pre-charged and the word line WL 104 is enabled, no external voltage is supplied to the bit lines BL 108a and 108b to continually charge or pre-charge the bit lines. In contrast, at 262, during the dummy read operation, the bit lines BL 108a and 108b are continually charged, even after these lines are fully pre-charged and even after the word line WL 104 is enabled. This continual charging of the bit lines BL 108a and 108b are, for example, achieved using the circuit 122 of FIG. 1. Also, during the dummy read, the bit lines BL 108a and 108b need not be connected to a sense amplifier (i.e., the value stored in the memory cell need not be actually read).

At 266, a regular read operation is then performed on the memory cell, e.g., by applying the first signal having the first voltage level to (A) power one or more of the plurality of transistors, (B) pre-charge the bit lines, and (C) charge the word line. That is, voltage VDD is used for the read operation at 266. Also, during the regular read operation at 266, the bit lines are only pre-charged (e.g., prior to enabling the word line), but unlike the operations at 262, the bit lines are not continually charged after enabling the word line.

Based on performing the regular read of the memory cell at 266, it is determined at 270 if the data written to the memory cell is corrupted. For example, if the data written at 258 matches the data read at 266, then the data written to the memory cell is not corrupted; and if the data written at 258 does not match the data read at 266, then the data written to the memory cell is corrupted.

If the data is corrupted, then at 274, it is determined that the memory cell has failed the test. The memory cell, for example, is discarded, as discussed with respect to 216 of FIG. 2A.

If the data is not corrupted, then at 278, it is determined whether both the first and second data has been selected. If "Yes" at 278, then at 282, the memory cell passes the test.

If "No" at 278, then at 286, second data is selected, where the second data is complementary to the first data (i.e., if the first data is 0, then the second data is 1, and vice versa). Subsequently, the method loops back to 258.

The memory cell failing the test (e.g., as in 274 of FIG. 2A) implies that the memory cell is likely to undergo a disturb failure while in operation. For example, in the method 250 (e.g., at 262 of the method 250), the memory cell is operated at considerable stress condition. For example, at 266, the bit lines BL 108a and 108b and the word line WL 104 are at voltage VDD, and the bit lines BL 108a and 108b are continually charged, while the transistor array T1, . . . , T4 are powered using a voltage VDDM that is lower than the voltage VDD. This generates a stress condition in the cell 102. If the cell 102 is prone to disturb failure (e.g., based on the mismatch and characteristics of the transistors T1, . . . , T6, noise in the transistors, etc.) and is likely to fail during the operational phase of the cell 102, then the cell 102 is also likely to undergo a disturb failure (e.g., due to the stressed operation a 262) and at least one of the first or second data is likely to be corrupted during the operations at 262 of the method 250. Thus, the method 250 is used to screen memory cells that are likely to undergo a disturb failure during the operational phase, and identify (and possibly discard) those memory cells.

Figure 3:
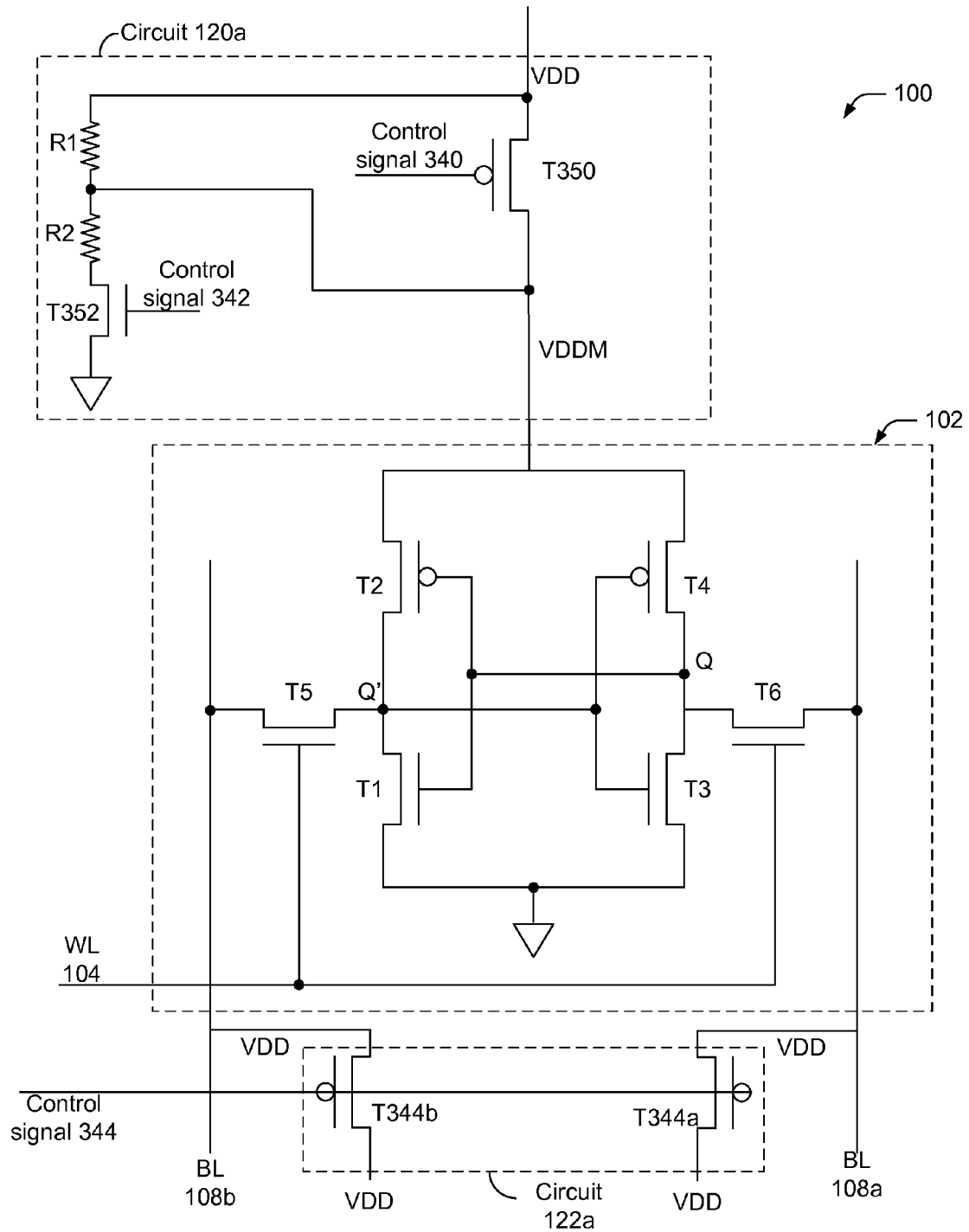
FIG. 3 schematically illustrates an example implementation of the system of FIG. 1.

FIG. 3 schematically illustrates an example implementation of the system 100 of FIG. 1. Specifically, FIG. 3 illustrates an example implementation of the circuits 120 and 122 of the system 100 of FIG. 1 in detail. In the implementation of FIG. 3, the circuits 120 and 122 are labeled as circuits 120a and 122a, respectively.

As discussed with respect to FIGS. 2A and 2B, during at least a part of the testing phase of the cell 102, the voltage VDDM is less than the voltage VDD. In the example of FIG. 3, the voltage VDDM is generated from the voltage VDD by a resistive voltage divider of the circuit 120a. The resistive voltage divider comprises resistors R1 and R2 coupled between the voltage VDD and a transistor T352. The transistor T352 is coupled between the resistor R2 and ground. A node between the resistors R1 and R2 supplies the voltage VDDM. Another transistor T350 is coupled between the voltages VDD and VDDM. In an example implementation, the transistors T350 and 352 are PMOS and NMOS transistors, respectively. In an embodiment, the transistors T350 and 352 are controlled by control signals 340 and 342, respectively.

While the cell 102 is operating at the operational phase (or at 258 and 266 of the testing phase of the method 250 of FIG. 2B), the transistor T350 is switched on and the transistor 352 is switched off (e.g., by controlling the control signals 340 and 342, respectively). Accordingly, during this time, the resistive voltage divider becomes non-operational, and the voltage VDDM is substantially equal to the voltage VDD.

During at least a part of the testing phase (e.g., at 262 of the testing phase of the method 250 of FIG. 2B), the transistor T350 is switched off and the transistor 352 is switched on (e.g., by controlling the control signals 340 and 342, respectively). Accordingly, the resistive voltage divider becomes operational, and the voltage VDDM is now based on values of the resistances R1 and R2. Thus, during a part of the testing phase of the cell 102, the voltage VDDM is less than the voltage VDD, and the difference between the two voltages can be controlled by appropriately selecting the resistances R1 and R2. The reduced value of the voltage VDDM is used at 262 of the method 250 of FIG. 2B.

In an embodiment, the bit lines BL 108a and BL 108b are controlled by a read or write circuit (not illustrated in the figures) associated with the cell 102. For example, the bit lines 108a and 108b are selectively pre-charged (e.g., using the voltage VDD) during the operational and testing phase of the cell 102. However, at 262 of the method 250 of FIG. 2B, the bit lines 108a and BL 108b are to remain continually charged (e.g., during the dummy read operation). This is, for example, achieved using the circuit 122a. The circuit 122a comprises transistors T344a and T344b, controlled by a control signal 344. The transistors T344a and T344b receive the voltage VDD, and selectively supply the voltage VDD to the bit lines 108a and BL 108b, respectively, based on a state of the control signal 344. For example, at 262 of the method 250 of FIG. 2B, the transistors T344a and T344b are switched on (and remain on) for supplying the voltage VDD to the bit lines 108a and BL 108b, respectively.

In an embodiment, the control signals 340, 342 and 344 are generated by a controller (not illustrated in FIG. 3) that is used for testing the cell 102.

Figure 4:
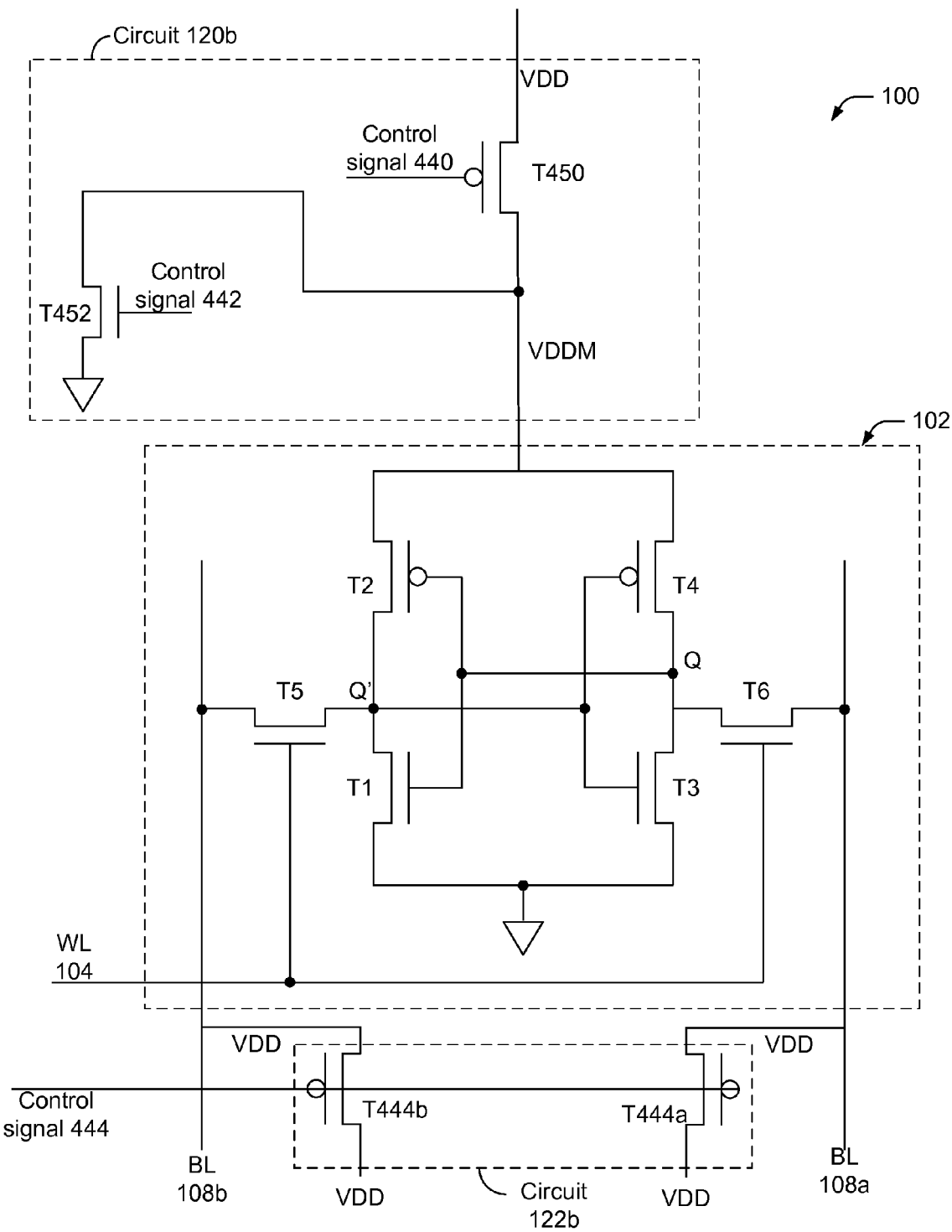
FIG. 4 schematically illustrates another example implementation of the system of FIG. 1.

FIG. 4 schematically illustrates another example implementation of the system 100 of FIG. 1. Specifically, FIG. 4 illustrates an example implementation of the circuits 120 and 122 of the system 100 of FIG. 1 in detail. In the implementation of FIG. 4, the circuits 120 and 122 are labeled as circuits 120b and 122b, respectively.

As discussed with respect to FIGS. 2A and 2B, during at least a part of the testing phase of the cell 102, the voltage VDDM is less than the voltage VDD. In the example of FIG. 4, the voltage VDDM is generated from the voltage VDD by a transistor divider of the circuit 120b. In the example of FIG. 4, transistors T450 and T452 are coupled in series, and controlled by control signals 440 and 442, respectively. A node between the transistors T450 and T452 supply the voltage VDDM. In an example implementation, the transistors T450 and T452 are PMOS and NMOS transistors, respectively.

While the cell 102 is operating at the operational phase (or at 258 and 266 of the method 250 of FIG. 2B), the transistor T450 is switched on and the transistor T452 is switched off (e.g., by controlling the control signals 440 and 442, respectively), and the voltage VDDM is substantially equal to the voltage VDD.

During at least a part of the testing phase (e.g., at 262 of the method 250 of FIG. 2B), both the transistors T450 and T452 are switched on (e.g., by controlling the control signals 440 and 442, respectively). As the two transistors T450 and T452 are switched on, the voltage VDDM is now less than the voltage VDD, and the difference between the voltages VDDM and VDD is based on a relative sizing of the transistors T450 and T452. For example, increasing a width to length (W/L) ratio of the transistor T452 results in the transistor T452 being strong, thereby resulting in a higher current through the transistor T452 and a smaller ON resistance of the transistor T452, which results in a relatively smaller value of the voltage VDDM. The voltage VDDM is, for example, controlled by controlling a ratio of a size and strength of the transistors T450 and T452. The reduced value of the voltage VDDM (e.g., compared to the voltage VDD) is used at 262 of the method 250 of FIG. 2B.

The implementation and operation of the circuit 122b of FIG. 4 is similar to the implementation and operation of the circuit 122a in FIG. 3. Accordingly, the circuit 122b of FIG. 4 is not discussed in further detail herein.

Figure 5:
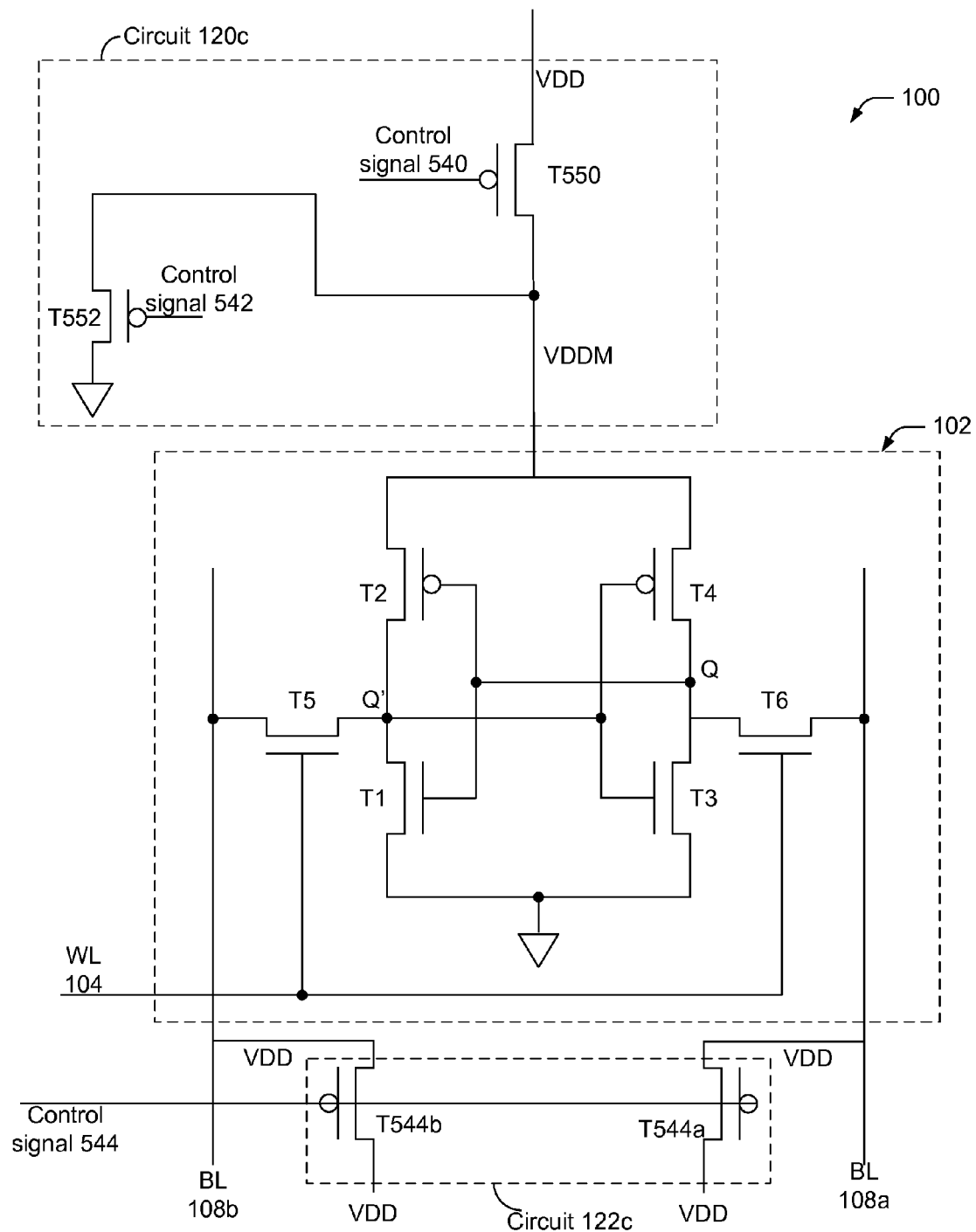
FIG. 5 schematically illustrates another example implementation of the system of FIG. 1.

FIG. 5 schematically illustrates another example implementation of the system 100 of FIG. 1. Specifically, FIG. 5 illustrates an example implementation of the circuits 120 and 122 of the system 100 of FIG. 1 in detail. In the implementation of FIG. 5, the circuits 120 and 122 are labeled as circuits 120c and 122c, respectively.

The implementation of the circuits 120c and 120b of FIGS. 5 and 4, respectively, are similar. For example, similar to the circuit 120b of FIG. 4, the circuit 120c of FIG. 5 comprises transistors T550 and T552 that are coupled in series, and that controlled by control signals 540 and 542, respectively. A node between the transistors T550 and T552 supply the voltage VDDM. However, unlike the transistor T442 of FIG. 4 (which is an NMOS transistor), the transistor T552 of FIG. 5 is a PMOS transistor. As both the transistors T550 and T552 are the same type of transistors, it is relatively easy to track for process variations between these two transistors (i.e., relatively easy to accurately control a ratio of the sizes of these two transistors).

The operation of the circuit 120c of FIG. 5 is at least in part similar to the operation of the circuit 120b of FIG. 4 (e.g., except for reversing the operation of the control signal 542 of FIG. 5 with respect to the control signal 442 of FIG. 4, e.g., as these two signals control a PMOS transistor and an NMOS transistor, respectively). Accordingly, the circuit 120c of FIG. 5 is not discussed in further detail herein.

The implementation and operation of the circuit 122c of FIG. 5 is similar to the implementation and operation of the circuit 122b in FIG. 4. Accordingly, the circuit 122c of FIG. 5 is not discussed in further detail herein.

Figure 6:
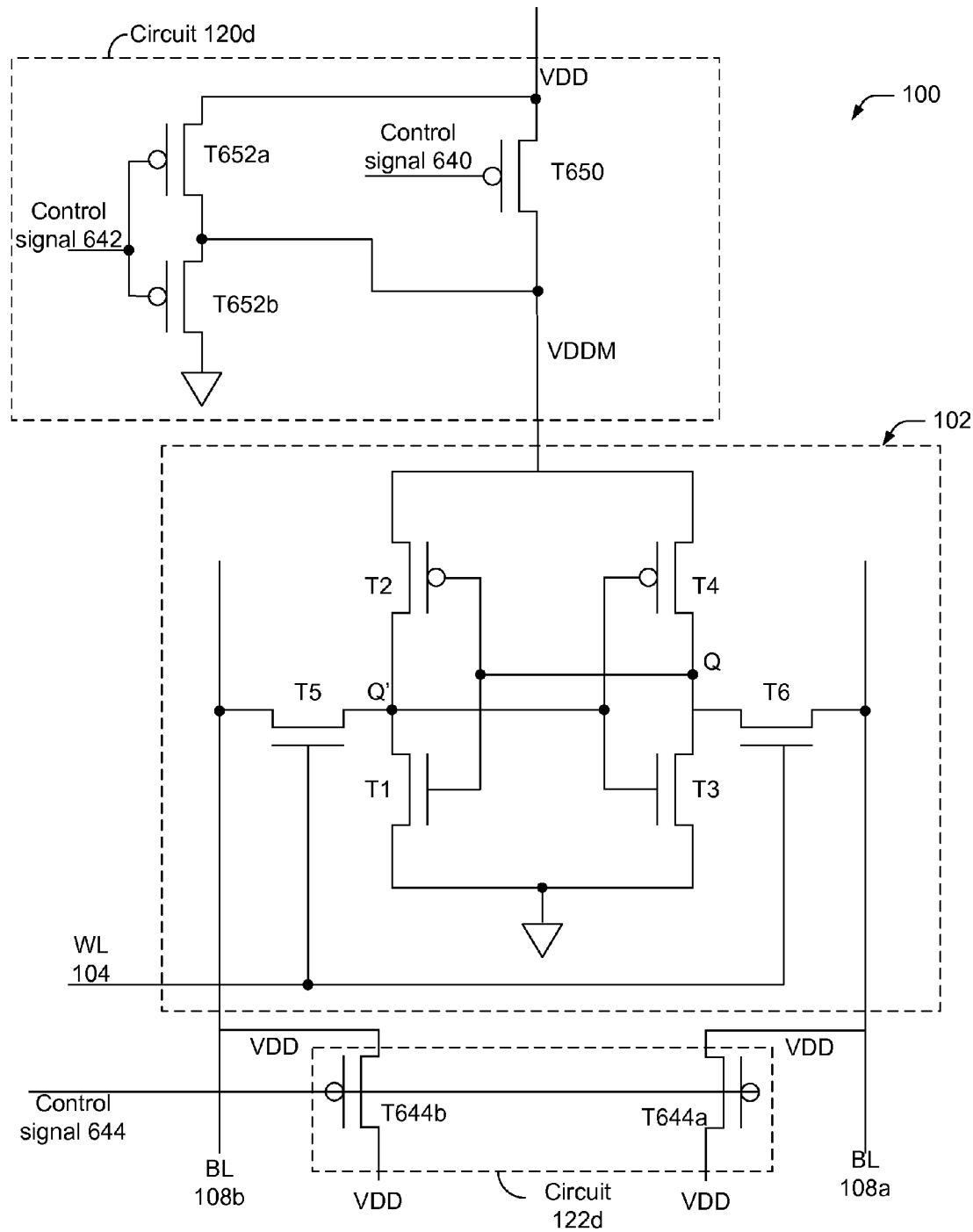
FIG. 6 schematically illustrates another example implementation of the system of FIG. 1.

FIG. 6 schematically illustrates another example implementation of the system 100 of FIG. 1. Specifically, FIG. 6 illustrates an example implementation of the circuits 120 and 122 of the system 100 of FIG. 1 in detail. In the implementation of FIG. 6, the circuits 120 and 122 are labeled as circuits 120d and 122d, respectively.

As discussed with respect to FIGS. 2A and 2B, during at least a part of the testing phase of the cell 102, the voltage VDDM is less than the voltage VDD. In the example of FIG. 6, the voltage VDDM is generated from the voltage VDD by a transistor divider of the circuit 120d. In the example of FIG. 6, transistors T652a and T652b are coupled in series between the voltage VDD and ground, and controlled by a control signal 642. A node between the transistors T652a and T652b supply the voltage VDDM. Another transistor T650 is coupled between the voltages VDD and VDDM, and is controlled by a control signal 640. In an example implementation, the transistors T650, 652a and 652b are PMOS transistors.

While the cell 102 is operating at the operational phase (or at 258 and 266 of the method 250 of FIG. 2B), the transistor T650 is switched on, and the transistors T652a and T652b are switched off (e.g., by controlling the control signals 640 and 642), and the voltage VDDM is substantially equal to the voltage VDD.

During at least a part of the testing phase (e.g., at 262 of the method 250 of FIG. 2B), the transistor T650 is switched off, and both the transistors T652a and T652b are switched on (e.g., by controlling the control signals 440 and 442, respectively). As the two transistors T652a and T652b are switched on and act as a transistor voltage divider, the voltage VDDM is now less than the voltage VDD, and the difference between the voltages VDDM and VDD is based on a relative sizing of the transistors T652a and T652b. For example, increasing a width to length (W/L) ratio of the transistor T652b results in the transistor T652b being strong, thereby resulting in a higher current through the transistor T652b and a smaller ON resistance of the transistor T652b, which results in a relatively smaller value of the voltage VDDM. The voltage VDDM is, for example, controlled by controlling a ratio of a size and strength of the transistors T652a and T652b. The reduced value of the voltage VDDM (e.g., compared to the voltage VDD) is used at 262 of the method 250 of FIG. 2B.

The implementation and operation of the circuit 122d of FIG. 6 is similar to the implementation and operation of the circuit 122a in FIG. 3. Accordingly, the circuit 122d of FIG. 6 is not discussed in further detail herein.

Figure 7:
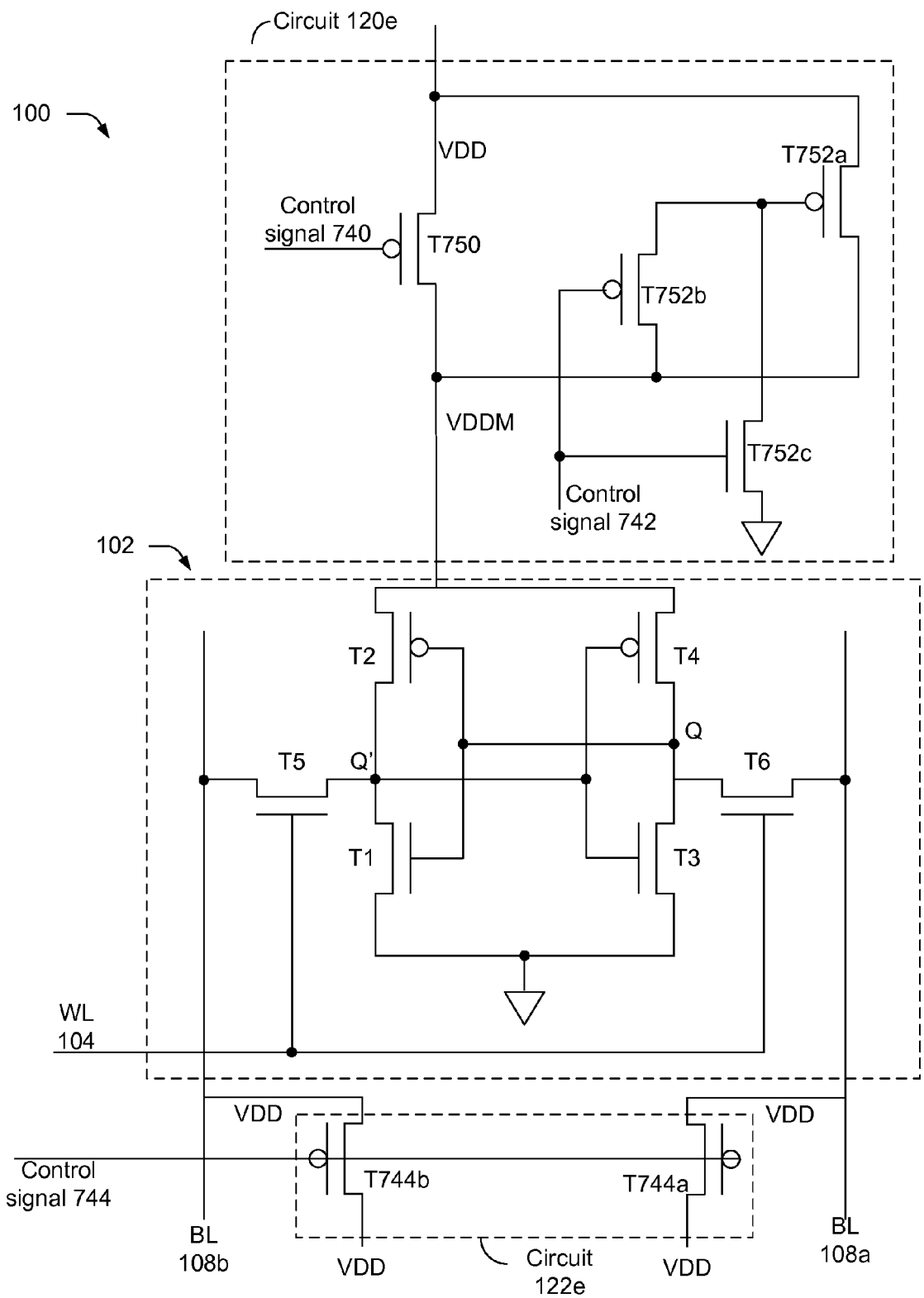
FIG. 7 schematically illustrates another example implementation of the system of FIG. 1.

FIG. 7 schematically illustrates another example implementation of the system 100 of FIG. 1. Specifically, FIG. 7 illustrates an example implementation of the circuits 120 and 122 of the system 100 of FIG. 1 in detail. In the implementation of FIG. 7, the circuits 120 and 122 are labeled as circuits 120e and 122e, respectively.

As discussed with respect to FIGS. 2A and 2B, during at least a part of the testing phase of the cell 102, the voltage VDDM is less than the voltage VDD. In the example of FIG. 7, the voltage VDDM is generated from the voltage VDD by a diode drop in a transistor T752a.

The circuit 120e of FIG. 7 comprises a transistor T750 coupled between the voltages VDD and VDDM, and controlled by a control signal 740. Another transistor T752a is also coupled between the voltages VDD and VDDM, and is in parallel to the transistor T750. A transistor T752c is coupled between a gate terminal of the transistor T752a and the ground. Another transistor T752b is coupled between the gate terminal of the transistor T752a and the voltage VDDM. The transistors T752b and T752c are controlled by a control signal 742. In an embodiment, each of the transistors T750, T752a and T752b is a PMOS transistor, and the transistor T752c is an NMOS transistor.

While the cell 102 is operating at the operational phase (or at 258 and 266 of the method 250 of FIG. 2B), the transistor T750 is switched on, the transistor T752b is switched off, and the transistor T752c is switched on (e.g., by controlling the control signals 740 and 742). Accordingly, the PMOS transistor T752a is also turned on (e.g., as it's gate terminal is grounded). Thus, during this time, both the transistors T750 and T752a are turned on, and the voltage VDDM is substantially equal to the voltage VDD.

During at least a part of the testing phase (e.g., at 262 of the method 250 of FIG. 2B), the transistor T750 is switched off, the transistor T752b is switched on, and the transistor T752c is switched off (e.g., by controlling the control signals 740 and 742). The transistor T752b shorts the gate and the drain terminal of the transistor T752a. Accordingly, during this time, the transistor T752a acts as a diode, with a drop of voltage VT in the transistor T752a. Accordingly, the voltage VDDM is equal to (VDD−VT), where the voltage VT is the threshold voltage of the transistor T752a. Thus, the voltage VDDM is less than the voltage VDD, and the difference between these two voltages can be controlled by controlling the threshold voltage VT of the transistor T752a.

The implementation and operation of the circuit 122e of FIG. 7 is similar to the implementation and operation of the circuit 122a in FIG. 3. Accordingly, the circuit 122b of FIG. 4 is not discussed in further detail herein.

In FIG. 3, the voltage VDDM is generated to be selectively lower than the voltage VDD using a resistor divider. In FIGS. 4-6, the voltage VDDM is generated to be selectively lower than the voltage VDD using a divider based on actions of two series coupled transistors. In FIG. 7, the voltage VDDM is generated to be selectively lower than the voltage VDD using a diode drop in a transistor. Also, in each of FIGS. 3-7, the same voltage VDD is received by the circuit 120 and 122. That is, the memory cell 102 of each of FIGS. 3-7 is a single power supply memory cell (i.e., receiving a single power supply having the voltage VDD).

Figure 8:
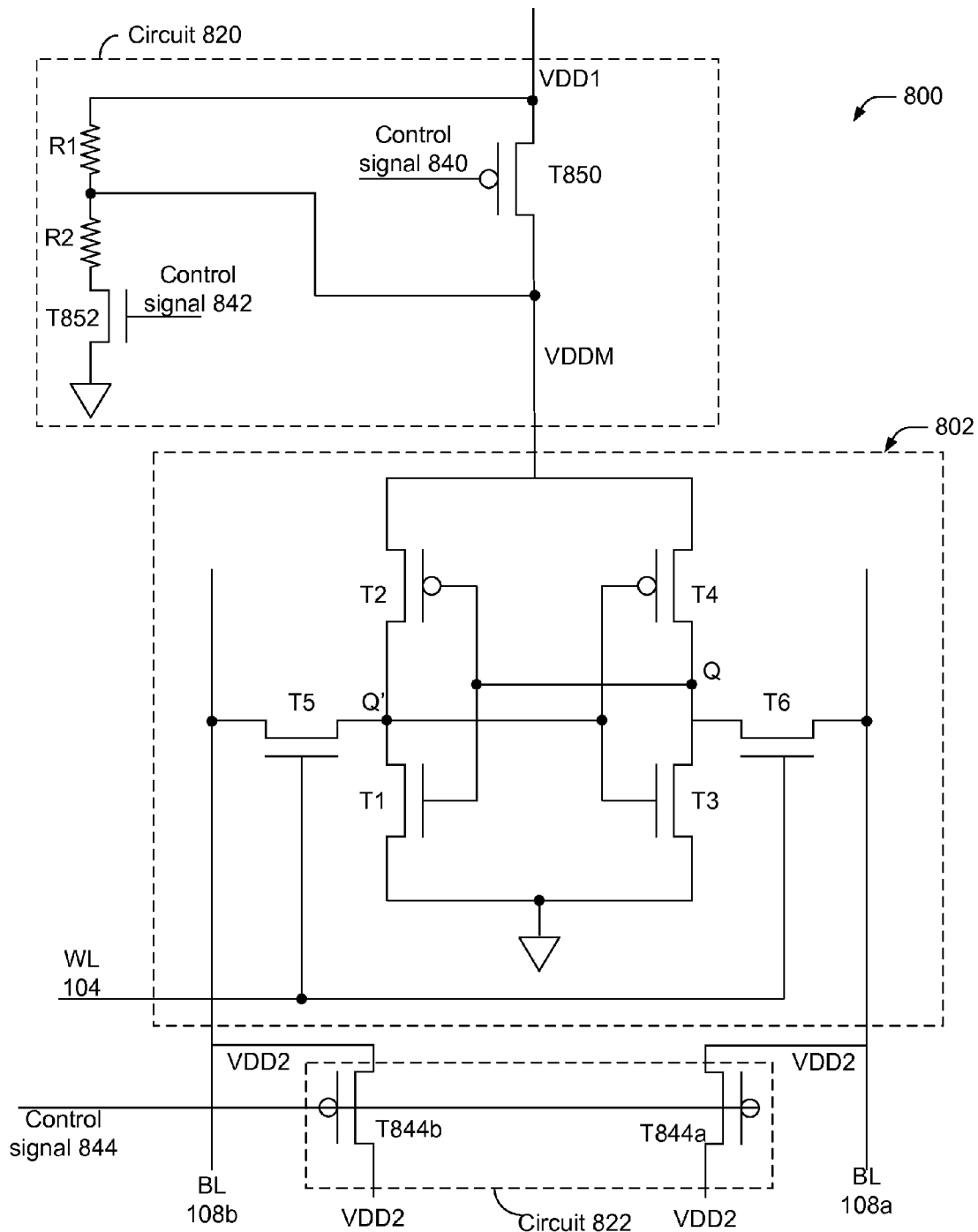
FIG. 8 illustrates a system for screening a memory cell for potential disturb failure, where the memory cell is a dual power supply memory cell.

However, a memory cell can also be a dual power supply memory cell. FIG. 8 illustrates a system 800 for screening a memory cell 802 (henceforth referred to as "cell 802") for potential disturb failure, where the cell 802 is a dual power supply memory cell. For example, the cell 802 receives power supplies VDD1 and VDD2, where VDD1 is different from VDD2. The system 800 is at least in part similar to the system 100 of FIG. 3. For example, similar to FIG. 3, the system 800 comprises circuits 820 and 822 (which are similar to the circuits 120a and 122a, respectively, of FIG. 3), receiving the voltages VDD1 and VDD2, respectively. The circuit 820 generates the voltage VDDM from the voltage VDD1, e.g., similar to the generation of the voltage VDDM from the voltage VDD by the circuit 120a of FIG. 3.

In an embodiment, while the cell 802 is operating at the operational phase (or at 258 and 266 of the method 250 of FIG. 2B), the voltage VDDM is substantially equal to the voltage VDD1. During at least a part of the testing phase (e.g., at 262 of the method 250 of FIG. 2B), the voltage VDDM is less than the voltage VDD1. As the circuits 820 and 822 of FIG. 8 are at least in part similar to the circuits 120a and 122a of FIG. 3, the circuits 820 and 822 of FIG. 8 are not discussed in further detail herein.

Although FIG. 8 illustrates using the resistor divider to generate the VDDM to be less than the voltage VDD1, in another embodiment, any of the circuits illustrated in FIGS. 4-7 may be used to generate the voltage VDDM from the voltage VDD1.

Figure 9:
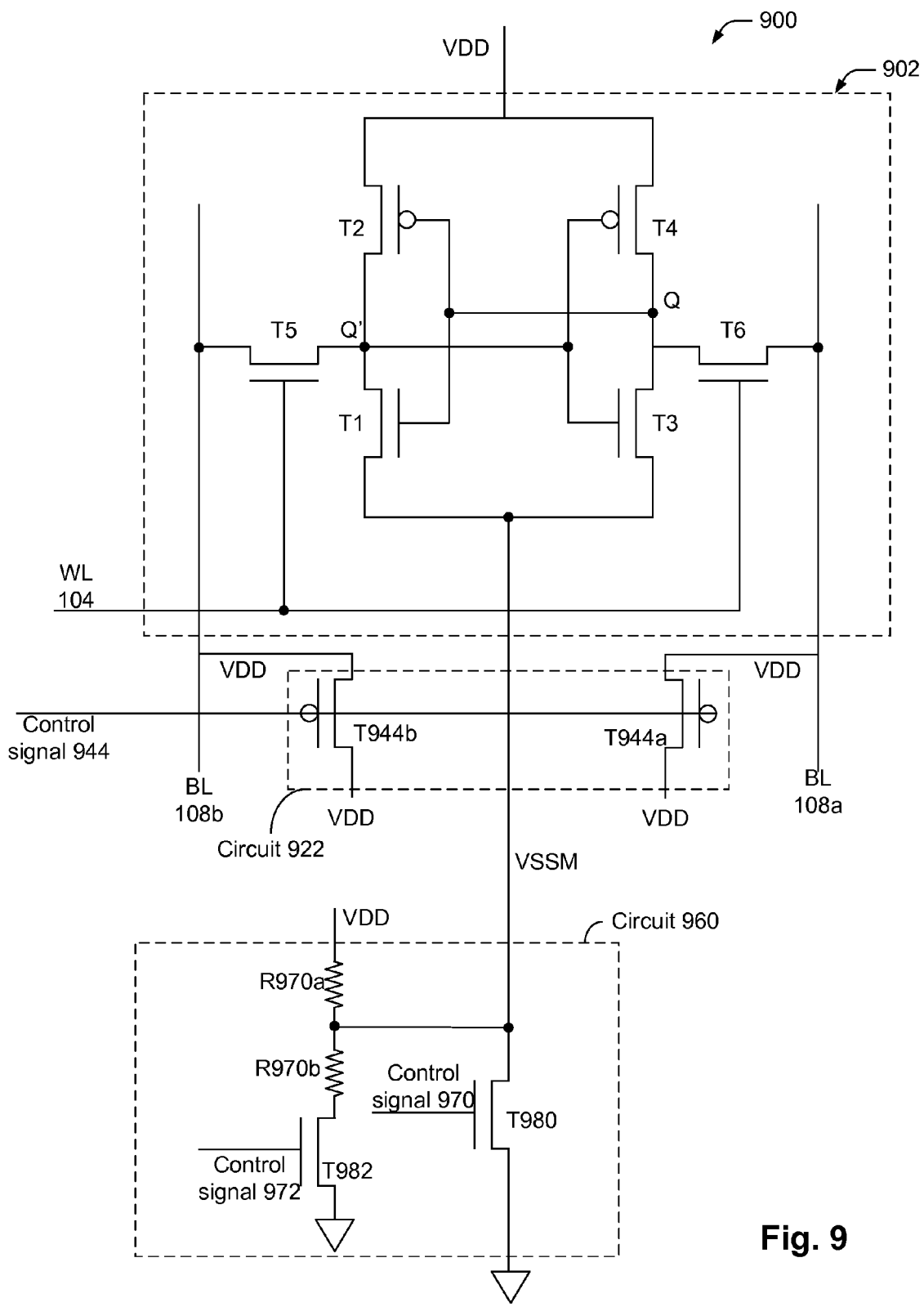
FIG. 9 schematically illustrates another system for screening a memory cell for potential disturb failure.

FIG. 9 schematically illustrates a system 900 for screening a memory cell 902 (henceforth also referred to as "cell 902," illustrated using a dotted line in FIG. 9) for potential disturb failure. The system 900 comprises the cell 902, and circuits 922 and 960.

The cell 902 and the circuit 922 are respectively similar to the cell 102 and the circuit 122 of FIGS. 1 and 3-7. Accordingly, the cell 902 and the circuit 922 are not discussed in more detail herein.

In FIGS. 1 and 3-7, the voltage VDDM is generated from the voltage VDD, and the voltage VDDM is applied to the array of transistors T1, . . . , T4 of the cell 102, where the voltage VDDM is selectively made lower than the voltage VDD (e.g., during 262 of the method 250 of FIG. 2B). In contrast, in FIG. 9, the voltage VDD is applied to the transistor array T1, . . . , T4 of the cell 900, and a voltage VSSM (through which the transistor array T1, . . . , T4 is grounded) is varied via the circuit 960. Thus, put differently, the system 900 of FIG. 9 is an upside down version of the system 100 of FIG. 1.

In an embodiment, the circuit 960 receives the voltage VSSM, and grounds the voltage VSSM via a transistor T980 controlled by a control signal 970. The circuit 960 further comprises a resistor divider comprising resistors R970a and R970b coupled in series between voltage VDD and a transistor T982. The transistor T982 is coupled between the resistor R970b and ground. The voltage VSSM is also coupled to a node between the resistors R970a and R970b.

While the cell 902 is operating at the operational phase (or at 258 and 266 of the method 250 of FIG. 2B), the transistor T980 is switched on and the transistor T982 is switched off (e.g., by controlling the control signals 970 and 972, respectively), and the voltage VSSM is grounded.

During at least a part of the testing phase (e.g., at 262 of the method 250 of FIG. 2B), the transistors T980 is switched off and the transistor T982 is switched on (e.g., by controlling the control signals 970 and 972, respectively). During this time, the transistor array T1, . . . , T4 are grounded via the resistor 970b and transistor T982. Also, during this time, the voltage VSSM is higher than the ground voltage (e.g., based on the voltage VDD via the resistor R970a), where the value of the voltage VSSM is based on the relative values of the resistances R970a and R970b.

Making the value of VSSM higher than the ground voltage (as discussed with respect to FIG. 9) is almost equivalent to making the voltage VDDM lower than the voltage VDD (as discussed with respect to FIGS. 1 and 3-7). Accordingly, the circuit 960 of FIG. 9 can also be used for screening the cell 902 for potential disturb failure, as discussed with respect to methods 200 and 250 of FIGS. 2A and 2B, e.g., after making appropriate changes to the methods 200 and 250. For example, if the system 900 is to be used for testing the memory cell 902 in accordance with the methods 200 and 250, then at 208 and 262 of these methods, the second signal is VSSM, which is selectively made higher than the ground voltage, and the second signal having the voltage VSSM is used to ground the one or more of the plurality of transistors of the memory cell.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   receiving a first voltage; and
   while testing a memory cell:
   (A) writing first data to the memory cell,
   (B) modifying the first voltage to generate a second voltage that is different from the first voltage,
   (C) subsequent to writing the first data to the memory cell, performing a first read operation on the memory cell, based on applying (i) the second voltage to an array of transistors of the memory cell and (ii) the first voltage to two bit lines of the memory cell, and
   (D) subsequent to performing the first read operation, performing a second read operation on the memory cell to read second data from the memory cell, based on applying the first voltage to (i) the array of transistors and (ii) the two bit lines of the memory cell.

2. The method of claim 1, wherein the second voltage is lower than the first voltage.

3. The method of claim 1, further comprising:
   during a regular operation of the memory cell, performing a plurality of read operations on the memory cell, wherein each of the plurality of read operations is based on applying the first voltage to (i) the array of transistors and (ii) the two bit lines of the memory cell.

4. The method of claim 1, further comprising:
   in response to the first data matching the second data, determining that the memory cell has passed the test; and
   in response to the first data not matching the second data, determining that the memory cell is prone to a disturb failure.

5. The method of claim 1, wherein modifying the first voltage to generate the second voltage comprises:
   applying the first voltage to a resistive voltage divider, wherein the resistive voltage divider comprises a first resistor and a second resistor; and
   receiving the second voltage from a node that is between the first resistor and the second resistor.

6. The method of claim 5, further comprising:
   while modifying the first voltage to generate the second voltage, activating the resistive voltage divider by switching on a switch that controls the resistive voltage divider; and
   while not testing the memory cell or while not modifying the first voltage to generate the second voltage, deactivating the resistive voltage divider by switching off the switch that controls the resistive voltage divider.

7. The method of claim 1, wherein modifying the first voltage to generate the second voltage comprises:
   coupling a first transistor and a second transistor in series;
   applying the first voltage to the first transistor;
   receiving the second voltage from a node between the first transistor and the second transistor;
   while modifying the first voltage to generate the second voltage, switching on each of the first transistor and the second transistor; and
   while not testing the memory cell or while not modifying the first voltage to generate the second voltage, switching off the second transistor.

8. The method of claim 1, wherein the memory cell is a static random-access memory (SRAM) cell.

9. The method of claim 1, wherein the first read operation is a dummy read operation that is performed without coupling the memory cell to a sense amplifier configured to read data stored in the memory cell.

10. The method of claim 9, wherein the second read operation is a normal read operation that is performed while the memory cell is coupled to the sense amplifier configured to read data stored in the memory cell.

11. The method of claim 1, further comprising:
    while testing the memory cell:
    (A) writing third data to the memory cell, the second data being different from the first data,
    (B) subsequent to writing the third data to the memory cell, performing a third read operation on the memory cell, based on applying (i) the second voltage to the array of transistors of the memory cell and (ii) the first voltage to two bit lines of the memory cell,
    (C) subsequent to performing the first third operation, performing a fourth read operation on the memory cell to read fourth data from the memory cell, based on applying the first voltage to (i) the array of transistors and (ii) the two bit lines of the memory cell,
    (D) in response to (i) the first data matching the second data and (ii) the third data matching the fourth data, determining that the memory cell is likely not prone to a disturb failure, and
    (E) in response to at least one of (i) the first data not matching the second data or (ii) the third data not matching the fourth data, determining that the memory cell is likely to be prone to the disturb failure.

12. A memory system comprising:
    a memory cell comprising an array of transistors, a word line, and two bit lines; and
    a circuit configured to:
    receive a first voltage, and
    while the memory cell is being tested:
    (A) write first data to the memory cell,
    (B) modify the first voltage to generate a second voltage that is different from the first voltage,
    (C) subsequent to writing the first data to the memory cell and while a first read operation is being performed on the memory cell, apply (i) the second voltage to the array of transistors and (ii) the first voltage to two bit lines of the memory cell, and (D) subsequent to the first read operation being performed and while a second read operation is being performed on the memory cell, apply the first voltage to (i) the array of transistors and (ii) the two bit lines.

13. The memory system of claim 12, wherein the second voltage is lower than the first voltage.

14. The memory system of claim 12, wherein the circuit is further configured to:

during a regular operation of the memory cell and while each of a plurality of read operations is being performed on the memory cell, apply the first voltage to (i) the array of transistors and (ii) the two bit lines.

15. The memory system of claim 12, wherein:

in response to the first data matching the second data, the memory cell passes the test; and in response to the first data not matching the second data, the memory cell is determined to be prone to a disturb failure.

16. The memory system of claim 12, wherein the circuit comprises a resistive voltage divider configured to modify the first voltage to generate the second voltage that is different from the first voltage, wherein the resistive voltage divider is enabled while the first read operation is being performed.

17. The memory system of claim 12, wherein the circuit comprises:

a resistive voltage divider configured to receive the first voltage, wherein the resistive voltage divider comprises a first resistor and a second resistor, and wherein the second voltage is received from a node that is between the first resistor and the second resistor; and a switch configured to control the resistive voltage divider, wherein while the first voltage is modified to generate the second voltage, the switch is configured to be switched on and activate the resistive voltage divider, and wherein while the memory cell is not being tested or while the first voltage is not being modified to generate the second voltage, the switch is configured to be switched off to deactivate the resistive voltage divider.

18. The memory system of claim 12, wherein the circuit comprises:

a first transistor and a second transistor coupled in series, wherein the first voltage is applied to the first transistor, wherein the second voltage is received from a node between the first transistor and the second transistor, wherein while the first voltage is modified to generate the second voltage, each of the first transistor and the second transistor is configured to be switched on, and wherein while the memory cell is not being tested or while the first voltage is not being modified to generate the second voltage, the second transistor is configured to be switched off.

19. The memory system of claim 12, wherein the memory cell is a static random-access memory (SRAM) cell.

20. The memory system of claim 12, further comprising:

a sense amplifier configured to read data stored in the memory cell, wherein the first read operation is a dummy read operation that is performed without coupling the memory cell to the sense amplifier, and wherein the second read operation is a normal read operation that is performed while the memory cell is coupled to the sense amplifier.

* * * * *